Figure 1:
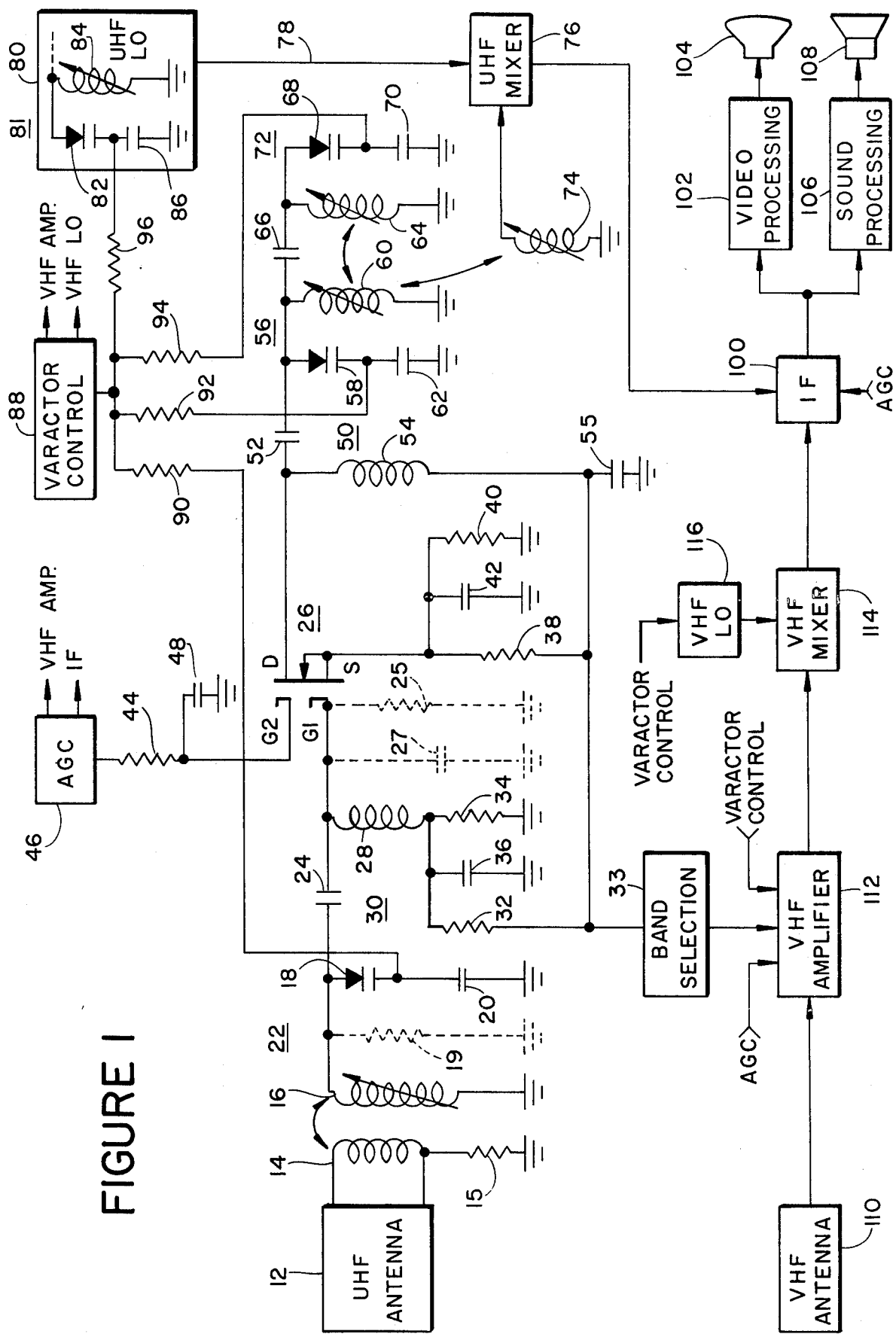

United States Patent [19]

Knight

[11] 4,048,598
[45] Sept. 13, 1977

[54] UHF TUNING CIRCUIT UTILIZING A VARACTOR DIODE
[75] Inventor: Stanley Paul Knight, Cranbury, N.J.
[73] Assignee: RCA Corporation, New York, N.Y.
[21] Appl. No.: 691,189
[22] Filed: May 28, 1976
[51] Int. Cl.² .......................... H03J 3/18; H03J 3/24; H03H 7/38
[52] U.S. Cl. .................................... 334/15; 325/318; 333/32
[58] Field of Search ........................... 333/32; 334/15; 307/304, 320; 325/318, 319

[56] References Cited
U.S. PATENT DOCUMENTS

| 3,570,005 | 3/1971 | Prolss | 325/319 X |
| 3,693,096 | 9/1972 | Dosey et al. | 334/15 X |

OTHER PUBLICATIONS

Johnson, Multiband L Matching Network, QST, vol. 39, No. 12, Dec. 1955, pp. 45-47.

Primary Examiner—Paul L. Gensler
Attorney, Agent, or Firm—Eugene M. Whitacre; Kenneth R. Schaefer; Peter M. Emanuel

[57] ABSTRACT

In the UHF tuning portion of a television receiver, a varactor tuned circuit is coupled to the gate electrode of a field effect transistor (FET) through an impedance transformation network comprising a series connected capacitor and shunt connected inductor. In order to increase the signal power transferred between the tuned circuit and the FET at the lower end of the UHF range, the values of the capacitor and inductor are selected so that the relatively low value of equivalent parallel impedance exhibited by the tuned circuit at the lower end of the UHF range is impedance transformed to a value approximately equal to the value of the impedance exhibited at the gate of the FET. A second impedance transformation network, similar to the first, is coupled between the drain of the FET and a second varactor tuned circuit to further increase the signal power transferred between the FET and the second tuned circuit at the lower end of the UHF band. The values of the capacitor and inductor comprising the impedance transformation networks are also selected so that the signal power gain of the UHF tuning portion at the upper end of the UHF range is not substantially degraded. Because of the impedance transformation networks, resonant points below the lowest frequency in the UHF band are established.

7 Claims, 3 Drawing Figures

UHF TUNING CIRCUIT UTILIZING A VARACTOR DIODE

The present invention relates to tuning systems suitable for television receivers and particularly to UHF (ultra high frequency) tuning systems.

Recently, much interest has developed in the use of varactor tuning diodes in tuning apparatus suitable for use, for example, in television receivers. Since varactor diodes are voltage controlled devices, television receivers employing such devices may be tuned electronically rather than by mechanical means, thereby improving their performance and reliability. Field effect transistors (FET's), which are readily gain controlled, provide a relatively good noise figure and produce a minimum of cross modulation, have been utilized in conjunction with varactor diodes in VHF (very high frequency) tuning systems.

Unfortunately, field effect transistors have tended to exhibit rather large parasitic input and output capacitances and as a result they have not been widely employed in conjunction with varactor diodes in UHF tuning circuits. Specifically, the capacitances associated with field effect transistors have until recently been of the same order of magnitude as the desired capacitances of varactor diodes for use in the UHF range. As a result, a tuning circuit comprising a varactor diode and an FET could not readily be arranged to be tuned over a sufficiently wide band in the UHF range.

Furthermore, because the equivalent parallel impedance of a tuned circuit including a typical varactor diode selected for use in a UHF tuned circuit is low at the low end of the UHF range while an FET is a relatively high impedance device, the signal power gain of a tuning circuit employing a varactor tuned circuit coupled, for example, to the gate electrode of an FET will be rather low at the low end of the band. Therefore, it is desirable to provide a UHF tuning circuit including a varactor tuned circuit and an FET which has an improved signal power gain at the low end of the UHF band. Furthermore, since the Q (and the equivalent impedance) of a varactor tuned circuit increases as a function of frequency, the UHF tuning system employing a varactor tuned circuit and an FET should desirably improve the signal power gain at the low end of the UHF range while not significantly degrading such power gain at the high end of the UHF range.

In accordance with the present invention, a tuned circuit means including a varactor diode is coupled to one electrode of a field effect transistor through an impedance transformation means. The impedance transformation means comprises a capacitor coupled serially between the tuned circuit means and the electrode and an inductor coupled in shunt with the electrode. The values of the capacitor and inductor are selected so that at the low end of the UHF range the impedances of the field effect transistor at the electrode and the impedance of the combination of the tuned circuit means and the impedance transformation means at the electrode are approximately matched.

In accordance with still another feature of the present invention, the values of the capacitor and the inductor are selected so that at the high end of the UHF range the impedances of the field effect transistor at the electrode and the impedance of the combination of the tuned circuit means and the impedance transformation means at the electrode are approximately matched.

In accordance with another feature of the present invention, the capacitor and inductor provide a resonance at a frequency below the lowest frequency in the UHF range.

In accordance with still another feature of the present invention, a first impedance transformation network is coupled between a first tuned circuit means including a first varactor diode and a gate electrode of the field effect transistor and a second impedance transformation network including a second varactor diode is coupled between the drain electrode of the field effect transistor and a second tuned circuit means including a second varactor diode.

Figure 2A:
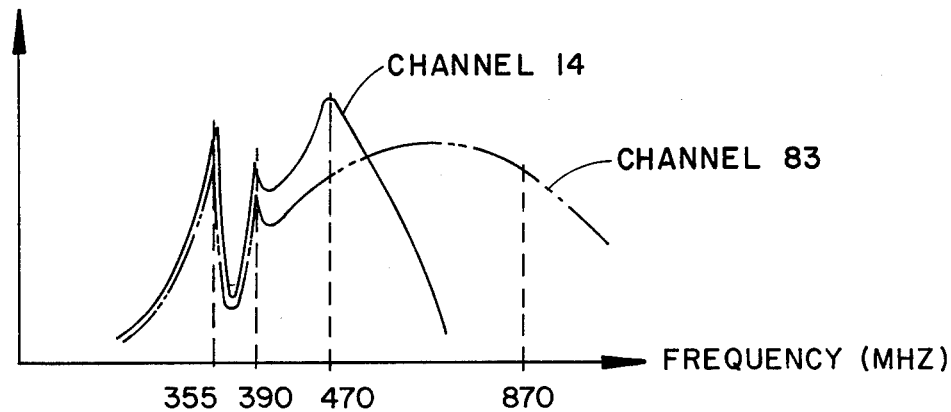
Figure 2B:
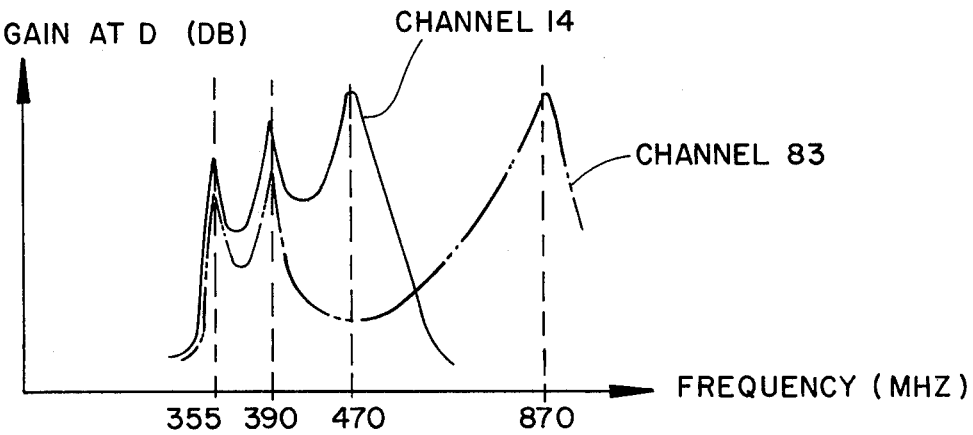

These and other features of the present invention may best be understood by reference to the following detailed description and accompanying drawings in which:

FIG. 1 shows partially in block diagram form and partially in schematic diagram form a television tuning system employing a UHF tuning circuit constructed in accordance with the present invention; and FIGS. 2A and 2B show graphical representations of amplitude versus frequency characteristics associated with the UHF tuning circuit shown in FIG. 1.

In the television receiver of FIG. 1, UHF broadcast carriers bearing television information are received by a UHF antenna network 12. The UHF carriers are coupled to an inductor 14, one end of which is coupled through a relatively high value resistor 15 to ground. UHF signals are magnetically coupled from inductor 14 to an inductor 16. One end of inductor 16 is coupled to ground. Inductor 14 and inductor 16 are arranged in what is sometimes called a Balun circuit to convert double ended (i.e., not referenced to ground) input signals provided via antenna network 12 into a single ended (i.e., referenced to ground) signal.

Inductor 16 is coupled in parallel with the series combination of a varactor 18 and a capacitor 20 to form a parallel resonant tuned circuit 22. A capacitor 24 serially couples the junction of varactor 18 and inductor 16 to the gate G1 of an N-channel field effect transistor (FET) 26. An inductor 28 is coupled in shunt with the gate G1 of FET 26. Series capacitor 24 and shunt inductor 28 form an impedance trasformation network 30 to improve the signal power gain of the UHF portion of the tuning system, as will be explained. Inductor 28 is provided with bias voltage from a band selection unit 33 via a resistance network comprising resistors 32 and 34. A bypass capacitor 36 effectively couples the junction of inductor 28 and resistor 34 to ground for signals in the UHF range.

The source S of FET 26 is provided with supply voltage from band selection unit 33 by means of a resistance network comprising resistors 38 and 40. The source is effectively coupled to ground in the UHF band by virtue of a bypass capacitor 42.

The drain D of FET 26 is coupled to a tuned circuit 56 through an impedance transformation network 50. Network 50 is similar to impedance transformation network 30 and comprises a shunt connected inductor 54 and a series connected capacitor 52. Inductor 54 is effectively coupled to ground for frequencies in the UHF band by a bypass capacitor 55. Supply voltage is coupled to the drain D of FET 26 from band selection unit 33 through inductor 54.

Automatic gain control (AGC) voltages generated by an automatic gain control unit 46 are coupled to the second gate G2 of FET 26 through resistor 44. The second gate G2 is effectively bypassed to ground for signals in the UHF range by a bypass capacitor 48.

Tuned circuit 56 comprises an inductor 60 coupled in parallel with the series combination of a varactor diode 58 and a capacitor 62. Inductor 60 is magnetically coupled to an inductor 64, the latter being coupled in parallel with the series combination of a varactor diode 68 and a capacitor 70 to form another tuned circuit 72. Inductor 60 is also electrically coupled to inductor 64 through a capacitor 66. Tuned circuits 56 and 72 are arranged to form what is commonly called a doubly tuned circuit.

Inductor 60 is in addition magnetically coupled to a variable inductor 74 to supply amplified UHF signals to a UHF mixer 76. Local oscillator signals are coupled to UHF mixer 76 from a UHF local oscillator 80. Local oscillator 80 includes another tuned circuit 81 comprising an inductor 84 coupled in parallel with the series combination of a varactor diode 82 and a UHF capacitor 86. Tuned circuit 81 determines the frequency of oscillation of local oscillator 80.

UHF mixer 76 combines the local oscillator signal provided by UHF local oscillator 80 and the amplified UHF signal provided by the UHF amplifier including FET 26 to derive an intermediate frequency (IF) signal. The IF signal is coupled to an IF processing unit 100 where it is amplified in accordance with an AGC voltage provided by AGC unit 46 and filtered. The output signal of IF processing unit 100 is coupled to a video processing unit 102 and to a sound processing unit 106. Video processing unit 102 processes chrominance and luminance and synchronization signals derived from the IF signal to form an image on kinescope 104 while sound processing unit 106 processes the sound signals derived from the IF signal which are converted to audible signals by speaker 108.

Varactor diode 18 of tuned circuit 22, varactor diode 58 of tuned circuit 56, varactor diode 68 of tuned circuit 72 and varactor diode 82 of tuned circuit 81 are respectively coupled to varactor control unit 88 through resistors 90, 92, 94 and 96. Varactor diodes 18, 58, 68 and 82 are poled to be reverse biased by a control voltage provided by varactor control unit 88 so they act as capacitors whose values are controlled in accordance with the control voltage. The capacitance of varactor diodes 18, 58, 68 and 82 increases in an inverse relationship with the control voltage.

VHF (very high frequency) signals are coupled to the receiver through a VHF antenna network 110, amplified by a VHF amplifier 112 and combined with local oscillator signals generated by a VHF local oscillator 116 in a VHF mixer 114 to form an IF signal. The IF signal derived by VHF mixer 114 is processed by IF processing unit 100, video processing unit 102 and sound processing unit 106 in a similar manner to the manner in which the IF signal derived by UHF mixer 76 is processed. Band selection, varactor control voltages and AGC voltages are coupled to the VHF tuning portion of the receiver from band selection unit 33, varactor control unit 88 and AGC unit 46, respectively.

Portions of the receiver shown in FIG. 1 may comprise circuits shown in RCA Television Service Data, File 1975 C-10 for the CTC-74 chassis published by RCA Corporation, Indianapolis, Indiana.

In operation, when a viewer selects a channel, band selection unit 33 derives band control signals in accordance with the band in which the selected channel resides. When a UHF channel has been selected, band selection unit 33 couples a positive supply voltage (e.g., +18 v.d.c.) to the UHF tuner which renders FET 26 conductive. Furthermore, varactor control unit 88 couples a control voltage in accordance with the selected channel (e.g., in the range of +1 v.d.c. to +26 v.d.c.) to varactor diodes 18, 58, 68 and 82. In response, tuned circuits 22, 56 and 72 are tuned to resonate at the frequency of the RF carrier corresponding to the selected channel (e.g., in the United States, tuned circuits 22, 56 and 72 are tuned in a range between 470 MHz and 890 MHz for channels 14 through 83) while tuned circuit 81 is tuned to the frequency of the appropriate local oscillator signal for the selected channel (e.g., in the United States, tuned circuit 81 is tuned in a range between 517 MHz and 930 MHz for channels 14 through 83). For any particular channel, the resonant frequency of tuned circuit 22 is determined by the effective capacitance of the series combination of varactor diode 18 and capacitor 20 and the inductance of inductor 16. The resonant frequencies of tuned circuits 56, 72 and 81 are similarly determined.

The UHF signals received by UHF antenna network 12 are filtered by tuned circuit 22 in accordance with the selected channel, amplified by FET 26 in accordance with the AGC voltage provided by AGC unit 46 and further filtered by the doubly tuned circuit comprising tuned circuits 56 and 72 also in accordance with the selected channel before being coupled to UHF mixer 76. Impedance transformation networks 30 and 50 are provided to increase the signal power gain of the UHF amplifier comprising FET 26 at the low end of the UHF range without significantly degrading the signal power gain at the high end of the UHF range in the following manner.

The equivalent circuit of tuned circuit 22 may be considered as comprising the parallel combination of an ideal inductor (i.e., being purely inductive), an ideal capacitor (i.e., being purely capacitive), and an ideal resistance 19 (i.e., being purely resistive). Although the value of the equivalent parallel resistance is a function of the resistances associated with inductor 16 and capacitor 20, it is primarily the resistance associated with varactor diode 18.

When tuned circuit 22 is resonant, i.e., when a channel in the UHF range is selected, the combination of the ideal inductor and ideal capacitor has a relatively large impedance. As a result, the amount of power transferred from tuned circuit 22 to the FET 26 is determined by the relationship between the equivalent parallel resistance of tuned circuit 22 and the input impedance of FET 26 at gate G1. That is, the equivalent parallel resistance of tuned circuit 22 may be thought of as a source impedance which should be at least approximately matched by the impedance at gate G1 of FET 26. The impedance of FET 26 at gate G1 is relatively large at the low end of the UHF band and decreases as a function of frequency. For example, an SFC-5421 dual gate MOSFET (metal-oxide silicon field effect transistor) available from Texas Instruments, Incorporated, suitable for use as FET 26, has an input resistance 25, at its first gate, of approximately 1,000 ohms and an input capacitance 27 of approximately 2.1 picofarads at the low end of the UHF range, i.e., at channel 14. The equivalent parallel resistance of tuned circuit 22 (approximately equal to the equivalent parallel resistance of varactor diode 18) is relatively small at the low end of the UHF range and increases with frequency. For example, a parallel tuned circuit utilizing a BB-105B available from Siemens Aktiengesellschaft of Germany varactor diode has an equivalent parallel impedance of 200 ohms at the low end of the UHF range. The resistance of the equivalent parallel resistance increases as a function of frequency because the control voltage, which reverse biases varactor diode 18, is increased as a function of frequency. Thus, if tuned circuit 22 were directly coupled to gate G1 of FET 26, the power transferred between tuned circuit 22 and gate G1 of FET 26 could be adequate at the high end of the UHF range, where the equivalent parallel resistance of tuned circuit 22 and the input impedance of FET 26 at gate G1 are approximately matched, but could be intolerable at the low end of the UHF range, where the equivalent parallel resistance of tuned circuit 22 and the input impedance of FET 26 and gate G1 are mismatched.

The power transferred between tuned circuit 22 and gate G1 of FET 26 at the low end of the UHF range (i.e., channel 14) is increased by coupling tuned circuit 22 to gate G1 through impedance transformation network 30. At the low end of the UHF range, impedance transformation network 30 effectively raises the impedance associated with tuned circuit 22 which is coupled to gate G1 to a value approximately matching the input impedance of FET 26 at gate G1. Alternatively, at the low end of the UHF range, impedance transformation network 30 may be thought of as lowering the impedance associated with FET 26 at gate G1 which is coupled to tuned circuit 22 to a value approximately matching the impedance of tuned circuit 22.

As previously mentioned, while the impedances associated with tuned circuit 22 are relatively mismatched at the low end of the band, as the frequency of operation increases, they get closer to being matched. Therefore, while the values of series capacitor 24 and shunt inductor 28 are selected to increase the power gain of the UHF amplifier including FET 26 at the low end of the UHF range, they are also selected so that the power gain at the high end of the UHF range is not significantly degraded. It has been found that by selecting the values of capacitor 24 and inductor 28 to provide a resonance point at a frequency below the lowest frequency of interest in the UHF band, e.g., in the United States, 470 MHz, the power gain of the UHF amplifier of FIG. 1 is increased at the low end of the UHF range while providing relatively little degradation at the high end of the UHF range. By selecting the value of series capacitor 24 in a range between 5.7 and 6.8 picofarads and the value of shunt inductor 28 in a range between 17 and 27 nanohenries, the power gain of the UHF amplifier at the low end of the UHF range is increased without significantly degrading the power gain at the high end of the UHF range. Within the ranges stated above, the values of series capacitance 24 and shunt inductor 28 may be selected for an optimum trade-off between power gain, noise figure, resonant circuit tracking and stability.

Furthermore, even though semiconductor manufacturers have recently learned how to reduce the parasitic capacitances associated with field effect transistors, such parasitic capacitances are still undesirably high compared with the capacitance of varactor diodes useful in UHF tuners. For example, an SFC-5421 dual gate MOSFET, suitable for use as FET 26, has a capacitance at its first gate (i.e., G1) in the range of 2.1 picofarads while the capacitance of the BB-105 varactor diode has a capacitance range of 2-14 picofarads for selected channels in the UHF range. Because capacitor 24 is in series with the parasitic capacitor associated with gate G1 of FET 26, represented by a capacitor 27, it effectively reduces the effect of the parasitic capacitor associated with gate G1 on the capacitance of varactor diode 18.

Still further, shunt inductor 28 provides a relatively low capacitance and low loss path for applying supply voltage to gate G1. This is advantageous since a resistor, which could be used for supplying power to gate G1, would tend to have a higher capacitance and loss associated with it than does an inductor.

In order to further improve the gain versus frequency characteristics of the UHF amplifier, impedance transformation network 50 comprising series capacitor 52 and shunt inductor 54 is coupled between the drain D of FET 26 and tuned circuit 56. Impedance transformation network 50 functions in a similar fashion to impedance transformation network 30. At the low end of the UHF range, impedance transformation network 50 effectively raises the impedance associated with tuned circuit 56 which is coupled to drain D to a value approximately matching the output impedance of FET 26 at drain D. To ensure that the power transferred between drain D and tuned circuit 56 is increased at the low end of the UHF range without significantly reducing the power transferred between drain D and tuned circuit 56 at the high end of the UHF range, the values of shunt inductor 54 and series capacitor 52 are selected to provide a resonant point below the lowest frequency of interest, e.g., 470 MHz, in the UHF range. For this purpose, shunt inductor 54 may be selected to have a value in a range between 25 and 37 nanohenries and series capacitor 52 may be selected to have a value in a range between 2.7 and 3.3 picofarads. Furthermore, series capacitor 52 isolates the relatively high parasitic capacitance (e.g., 1.5 picofarads for an SFC-5421 MOSFET) associated with drain D from varactor diode 58. In addition, shunt inductor 54, provides a relatively low capacitance path for coupling supply voltage to drain D.

The voltage versus frequency response characteristics for the voltage developed at gate G1 for channels 14 and 83 are graphically represented in FIG. 2A. It is noted that for each characteristic, there are two resonant frequency points below the frequency (e.g., 470 MHz) associated with channel 14. The first resonant point at 355 MHz is due to impedance transformation network 30 in the gate circuit of FET 26. The second resonant point at 390 MHz is due, in essence, to a reflection of impedance transformation network 50 in the drain circuit of FET 26. It is noted that the gains for channels 14 and 83 are both relatively high. Nevertheless, the gain for channel 83 is somewhat lower than the gain for channel 14. However, it is seen from the response characteristics for the voltage developed at drain D of FET 26 of FIG. 2B that the gains for channels 14 and 83 are approximately the same. Once again, it is noted that there are two resonant points below the lowest frequency of interest in the UHF band (e.g., 470 MHz) respectively corresponding to impedance transformation networks 30 and 50. Furthermore, it is noted that the resonant frequency associated with impedance transformation network 50 occurs between the resonant frequency associated with impedance transformation network 30 and the lowest frequency of interest in the UHF range.

Since the values of series capacitor 24, shunt inductor 28, shunt inductor 54 and series capacitor 52 are selected to provide resonant points below the lowest frequency of interest in the UHF band, as is indicated in FIGS. 2A and 2B, tuned circuits 22, 56, 72 and 81 can be made to track each other through the entire UHF band. If the impedance transformation elements were selected to provide resonant points above the lowest frequency of interest in the UHF range, tracking between the responses of resonant circuits 22, 56, 72 and 81 could not be readily obtained because tuned circuits 22 and 56 would be affected by impedance transformation networks 30 and 50, respectively, in the UHF range, while tuned circuits 72 and 81 would not be affected by the impedance transformation networks.

With the values shown in FIG. 1 indicated above, an overall gain improvement of approximately 4 dB (decibel) may be obtained. In addition, because the gain of the first stage of the UHF tuner, i.e., the stage including FET 26, is increased at the low end of the UHF band by the inclusion of the two impedance transformation circuits, the noise figure of the UHF tuner is correspondingly improved.

What is claimed is:

1. In a UHF tuner, the apparatus comprising:
a tuned circuit including a varactor diode;
a field effect transistor having a plurality of electrodes including a gate electrode;
an impedance transformation means coupled between said tuned circuit and said gate electrode of said field effect transistor, said impedance transformation means including capacitance means coupled in series between said tuned circuit and said gate electrode and inductance means coupled in shunt with said gate electrode, said capacitance means and said inductance means being selected to provide a resonant frequency below the lowest channel frequency in the UHF range so that the impedance coupled to said gate electrode is approximately matched with the impedance of said field effect transistor at said gate electrode at the low end of the UHF range and the power gain of said apparatus at the low end of said UHF range is approximately equal to the power gain of said apparatus at the high end of said UHF range.

2. The apparatus recited in claim 1 wherein said tuned circuit includes an inductor coupled in parallel relationship with said varactor diode, said capacitance means of said impedance transformation means being coupled between said varactor diode and said gate electrode.

3. In a UHF tuner, the apparatus comprising:
a first tuned circuit including a first varactor diode;
a field effect transistor having a plurality of electrodes;
a first impedance transformation means coupled between said first tuned circuit and a first electrode of said field effect transistor, said first impedance transformation means including first capacitance means coupled in series between said first tuned circuit and said first electrode and first inductance means coupled in shunt with said first electrode;
a second tuned circuit including a second varactor diode; and
a second impedance transformation means coupled between a second electrode of said field effect transistor and said second tuned circuit, said second impedance means including second inductance means coupled in shunt with said second electrode and second capacitance means coupled in series between said second electrode and said second tuned circuit;
said first capacitance and inductance means and said second inductance and capacitance means being selected to provide respective first and second resonant frequencies below the lowest channel frequency in the UHF range so that the impedance coupled to said first electrode is approximately matched with the impedance of said field effect transistor at said first electrode at the low end of the UHF range, the impedance coupled to said second electrode is approximately matched with the impedance of said field effect transistor at said second electrode at the low end of the UHF range, and the power gain of said apparatus at the low end of said UHF range is approximately equal to the power gain of said apparatus at the high end of said UHF range.

4. The apparatus recited in claim 3 wherein said first electrode is a gate electrode and said second electrode is a drain electrode.

5. The apparatus recited in claim 4 wherein the second resonant frequency is between the first resonant frequency and the lowest channel frequency in the UHF range.

6. The apparatus recited in claim 5 wherein said field effect transistor includes a second gate electrode to which an automatic gain control voltage is coupled.

7. The apparatus recited in claim 6 wherein a first band selection voltage is coupled to said first inductance means and a second band selection voltage is coupled to said second inductance means.

* * * * *